United States Patent [19]
Bolz et al.

[11] Patent Number: 5,238,866
[45] Date of Patent: Aug. 24, 1993

[54] PLASMA ENHANCED CHEMICAL VAPOR DEPOSITION PROCESS FOR PRODUCING AN AMORPHOUS SEMICONDUCTIVE SURFACE COATING

[75] Inventors: Armin Bolz; Max Schaldach, both of Erlangen, Fed. Rep. of Germany

[73] Assignee: GmbH & Co. Ingenieurbüro Berlin Biotronik Mess- und Therapiegeräte, Berlin, Fed. Rep. of Germany

[21] Appl. No.: 756,568

[22] Filed: Sep. 11, 1991

[51] Int. Cl.$^5$ .................. H01L 21/00; H01L 21/02; H01L 21/20
[52] U.S. Cl. .................. 437/100; 437/101; 148/DIG. 1; 257/77
[58] Field of Search ............... 437/100, 101; 148/DIG. 1; 257/77

[56] References Cited

U.S. PATENT DOCUMENTS

| | | | |
|---|---|---|---|
| 4,289,822 | 9/1981 | Shimada et al. | 437/2 |
| 4,388,482 | 6/1983 | Hamakawa et al. | 136/258 |
| 4,726,851 | 2/1988 | Matsumura et al. | 437/101 |
| 4,755,483 | 7/1988 | Haku et al. | 437/101 |
| 5,011,706 | 4/1991 | Tarhay et al. | 437/100 |
| 5,061,322 | 10/1991 | Asano | 437/100 |

FOREIGN PATENT DOCUMENTS

| | | |
|---|---|---|
| 0371908A | 6/1990 | European Pat. Off. |
| 2360686 | 8/1974 | Fed. Rep. of Germany |
| 0280682 | 12/1986 | Japan |
| 0029132 | 2/1987 | Japan |
| 0284809 | 11/1988 | Japan |

OTHER PUBLICATIONS

Bolz, New Coating Materials for Artificial Heart Valves, Proceedings of the IEEE Medicine and Biology Society, Nov. 1989.

*Primary Examiner*—Brian E. Hearn
*Assistant Examiner*—B. Everhart
*Attorney, Agent, or Firm*—Spencer, Frank & Schneider

[57] ABSTRACT

A plasma enhanced chemical vapor deposition (PECVD) process for producing an amorphous semiconductive surface coating consisting essentially of hydrogenated silicon carbide (a-SiC:H) having an improved blood compatibility, the process including positioning a substrate to be coated in a reactor chamber; heating the substrate to a substrate temperature ranging from 0° C. to 350° C.; providing a flow of a reactive gas mixture including from about 50 to about 100% of methane ($CH_4$), from about 0 to about 50%, of silane ($SiH_4$), and from about 0 to about 2% of phosphine ($PH_3$), the flow having a flow rate based on a flow rate of silane ($SiH_4$) which ranges from 10 to 50 sccm, the methane ($CH_4$) and the phosphine ($PH_3$) having respective flow rates which are based on the flow rate of the silane ($SiH_4$); introducing the flow of the reactive gas mixture into the reactor chamber to provide a process pressure ranging from 0.2 to 1 mbar; generating a plasma with a power supply under conditions effective to deposit on the substrate an amorphous semiconductive surface coating of hydrogenated silicon carbide (a-SiC:H) having an electronic band gap greater than 2.0 eV between its valance band and its conduction band, and having an electrical conductivity greater than $10^{-4}$ $(\Omega cm)^{-1}$, whereby the amorphous semiconductive surface coating has an improved compatibility with blood.

4 Claims, 3 Drawing Sheets

PLASMA ENHANCED CHEMICAL VAPOR DEPOSITION PROCESS FOR PRODUCING AN AMORPHOUS SEMICONDUCTIVE SURFACE COATING

BACKGROUND OF THE INVENTION

The present invention relates to an amorphous semiconductive surface coating for a surfical implant, and more particularly, it relates to methods of making such surface coatings.

Surgical and, in particular, cardiovascular implants must be highly compatible with blood in order to reduce the risk of valve occlusions by thrombus, thromboembolism and anti-coagulant-related hemorrhage. It is known that for antithrombogenity it is necessary to have a low peak-to-valley height (roughness) in order to prevent the deposition and destruction of corpuscular components of the blood and the activation of the coagulation system connected therewith. Further, it is also known that direct charge exchanges between coagulation-specific proteins and the implant surface must also be prevented.

Because of its excellent surface finish, pyrolytic carbon was at first used as a cardiovascular implant material but the hemocompatibility of this material was less than desired, because of the electronic structure of the surface. A transfer of electrons as a result of tunneling of occupied, valence band-like states of the blood protein into free states of the solid leads to a splitting of the fibrinogen in the blood. The thus-resulting fibrin monomers may then polymerize and lead to an irreversible thrombus.

A doped, semiconducting rutile ceramic with a higher hemocompatibility than pyrolytic carbon was then used but technological problems related to the surface roughness of this material made the manufacturing costs prohibitive.

It is already known to coat surgical and in particular cardiovascular implants with an amorphous semiconductive thin film. Coating has the advantage that the substrate material need only meet the demand for mechanical stability, whereas the antithrombogenic requirements are fulfilled by the amorphous semiconductive surface layer.

SUMMARY OF THE INVENTION

It is an object of the present invention to provide an amorphous semiconductive surface coating for surgical and, in particular, for cardiovascular implants of the above-mentioned type, which is of optimum blood compatibility and which can be manufactured in a cost effective manner, and also to provide a method of making such a surface coating.

This object and others to become apparent as the specification progresses, are accomplished by the invention, according to which, briefly stated, the amorphous semiconductive material of the surface coating is produced by way of a PECVD (plasma enhanced chemical vapor deposition) process, has an electronic band gap equal to or greater than 2.0 eV, and has an electrical conductivity equal to or greater than $10^{-4}(\Omega\ cm)^{-1}$.

A special semiconductor alloy, amorphous hydrogenated silicon carbide (a-$Si_xC_{1-x}$:H), which is known as a window material for amorphous solar cells because of its excellent electronic properties, is used as the material for this surface coating.

The lowest band gap density of states can be acheived with activated CVD techniques, particularly with plasma-enhanced CVD (PECVD), referred to as the glow discharge technique, which is well known from the research about amorphous solar cells.

There is a low density of unoccupied states in the energy range of the transfer level of the blood protein, fibrinogen, if the electronic band gap of the surface coating is greater than 2.0 eV, and a stable electrochemical equilibrium can be ensured at the interface between the blood protein and the surface coating of the implant, if the electrical conductivity of the surface coating is greater than $10^{-4}(\Omega\ cm)^{-1}$.

It has been found that the above properties can be obtained, if the supplied process gases of the PECVD process are 10% silane ($SiH_4$) diluted with hydrogen as the silicon supply, and pure methane ($CH_4$) for carbon alloyinging together with 0.1% of phosphine ($PH_3$) also diluted with hydrogen for doping. The optimal parameters are the following:

| | |
|---|---:|
| Pressure range: | 0.02–1 mbar |
| Optimal value: | 0.1 mbar |
| Gas composition: | 50–80% methane |
| | 100–0% silane |
| | 0–2% phosphine |
| Gas flow: | 10–50 sccm silane |
| Optimal gas composition: | 49.5–79.8% methane |
| | 20–50% silane |
| | 0.2–0.5% phoshine |
| Substrate temperature: | 0–350° C. |
| Optimal temperature: | 250° C. |

Preferably, such a surface coating deposited with a 50% methane concentration has an electronic band gap of 2.1 eV compared to a surface coating of pure silicon which has an electronic band gap of 1.8 eV. This surface coating also has an electrical conductivity of $10^{-4}(\Omega\ cm)^{-1}$ as compared to the electrical conductivity of an undoped layer which is approx. $10^{-9}(\Omega\ cm)^{-1}$. Due to the n-type doping with approx. 0.2% of phosphine, the electrical conductivity of the surface coating is now approximately equal to that of the blood protein, fibrinogen, ($10^{-5}(\Omega\ cm)^{-1}$), so that the band bending, which occurs if the electrical conductivity of the surface coating differs from that of the blood protein, fibrinogen, decreases from 1.0 eV to 0.7 eV. A further increase in the electrical conductivity of the surface coating is not advisable as an increased doping concentration of phosphine leads to a decrease in the size of the electronic band gap of the surface coating.

The critical energy interval, the valence band of the fibronigen lies between −0.9 and −1.3 eV. In this same interval, the density of unoccupied states in the surface coating ranges from $10^7$ unoccupied states at −0.9 eV and $10^1$ unoccupied states at −1.3 eV. Since the band gap of the surface coating has increased and now lies between −1.7 eV and 0.4 eV with a band bending of only 0.7 eV, the density of the states in front of the valence band of the blood protein, fibronigen, is therefore lowered by three orders of magnitude, the charge transfer is inhibited and the blood protein, fibronigen, remains stable.

The optimal methane concentration is near 50% and the most advantageous range in which it can be varied lies between 30% and 70%. A concentration of about 50% is of advantage in order to ensure that the corrosion rate of the surface coating is low. It has been found that the rate of corrosion of the surface coating decreases rapidly above a methane concentration of 30%. A concentration of methane, which is greater than the maximum advantageous concentration of 70% has no great effect on the hemocompatibility of the surface coating, as the further increase in the electronic band gap of the surface coating which occurs due to this does not effect the clotting time because it is not possible to decrease the density of states in the surface coating further still.

Furthermore, since a maximum of hardness and durability can also be achieved with a methane concentration of about 50% due to the increased number of SiC bonds, for higher values of methane concentration the hardness of the surface coating does not further increase due to the influence of the higher carbon hydrides. Thus, it is not necessary in most cases to increase the methane concentration to more than 70%.

Surface coatings were deposited on glass substrates at temperatures of 250° C. and 350° C. with varying methane concentrations and measured with a spectrophotometer. It was found that the optimal electronic band gap was smaller at a temperature of 350° C. than at 250° C. In other experiments, it was also found that the electronic band gap decreases above 150° C. if the surface coatings contain carbon and reach 90% of their original value at approximately 300° C. This is due to the reaction of $CCH_3$ to $CCH_x$ (with $x \leq 3$) as the CC bonds increase the state density in the tail states. Thus, 250° C. is the optimum process temperature with regard to a large electronic band gap. In addition, it was also found that the hardness of the coating was not greatly decreased at this lower temperature of 250° C. It is nevertheless theoretically possible for the substrate temperature to lie anywhere between 0° C. and 350° C., but the most advantageous temperature range lies between 250° C. and 350° C. with 250° C. being the optimum process temperature.

A gas flow of between 10 and 50 sccm was found to be optimal as a greater flow leads to the production of polysilane particles.

DESCRIPTION OF PREFERRED EMBODIMENTS AND OF THE BEST MODE OF THE INVENTION

Figure 1:
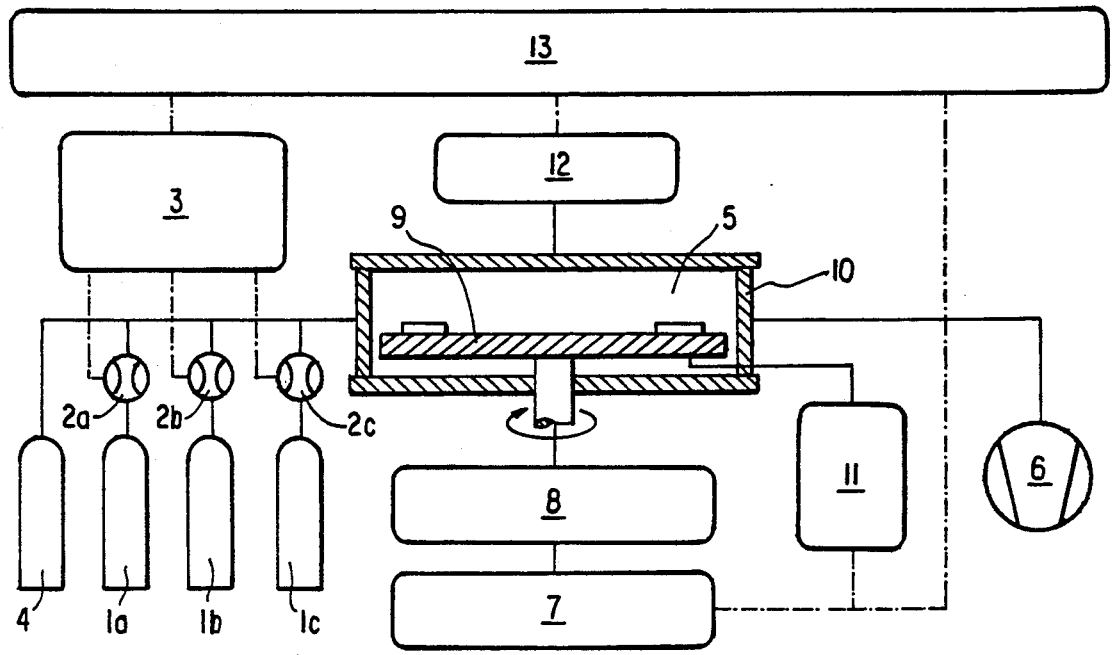
FIG. 1 is conceptional view of a PECVD device used for performing the method according to the present invention.

FIG. 1 is a conceptional view of a PECVD device for illustrating the performance of a method according to an embodiment of the present invention. The system consists of three basic parts, a gas supply, a vacuum system and a power supply for the electrical plasma. The gas supply contains the source gases $SH_4$, $CH_4$ and $PH_3$ 1a, 1b and 1c and a control system 3 with flow meters 2a, 2b and 2c for the correct mixing of the components. Also, an inert gas like nitrogen 4 is necessary for cleaning the system. Before the start of the coating process, the reactor chamber 5 must be evacuated to high vacuum (about $10^{-4}$ mbar or lower) by rotary and turbomolecular pumps 6. This is necessary in order to avoid the pollution of the process gas. When emptied, the process pressure is regulated by the gas flow into the reactor and the power of the roughing pump only. A radiofrequency power supply 7, typically operating at a frequency of 13.56 MHz has been used for plasma generation. Box 8 represents a circuit for matching the output resistance of the power supply 7 to the input resistance of the plasma system. The drawn reactor geometry is of a so-called planar type due to fact there is a flat rotating substrate disc 9 forming one electrode, while the other electrode is formed by the chamber wall 10. The best results, from an electronic point of view, are obtained with a spatial separation of the plasma and the substrates, because in this way the defects caused by impinging ions are diminished. Another feature of this system is the substrate temperature control 11 unit. The substrate holder 9 is heated electrically. The actual pressure in the reactor 5 is obtained by absolute pressure measuring equipment 12, such as a baratron, as the measured value would otherwise not be sufficiently independent of the kind of gases. The complete system is supervised by a programmable system control circuit 13.

This technology, whilst producing surface coatings with good electrical properties also has a number of additional advantages, such as the process temperature being relatively low so that a wide range of substrate materials can be chosen from. In addition it is possible to adapt the properties of the surface coating to the required application by simply varying the corresponding process parameters and one can coat complex shapes because the coating process is determined by diffusion-limited aggregation.

Figure 2:
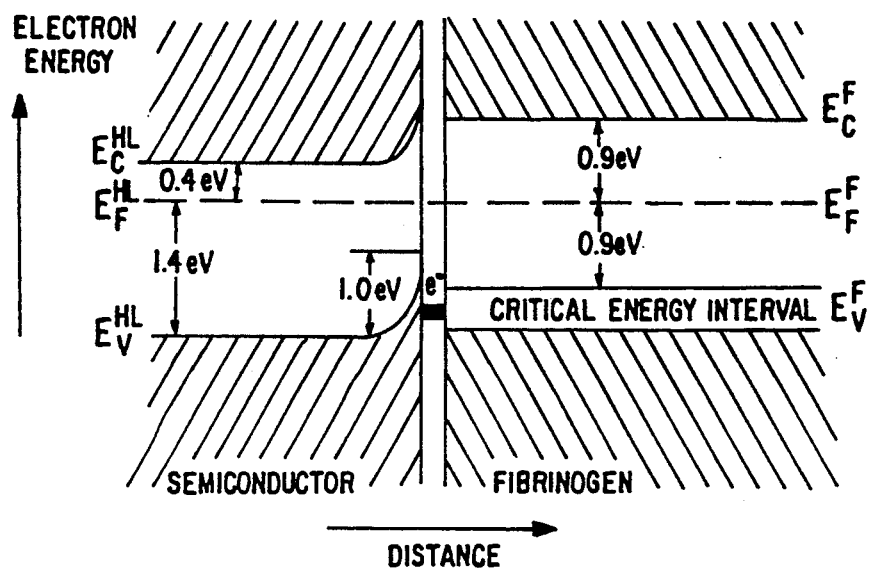
FIG. 2 is a diagram showing the charge distribution and potentials at the interface between pure amorphous silicon an an aqueous fibrinogen solution.

FIG. 2 shows the charge distribution and potentials at the interface between pure amorphous silicon a-Si:H and an aqueous fibrinogen solution achieved. The superscripts HL and F refer to the amorphous silicon a-Si:H and the fibrinogen respectively. For pure amorphous silicon HL the electronic band gap $E_g$ is about 1.8 eV, the position of the Fermi level $E_f$ is about 0.4 eV below the lower edge $E_c$ of the conduction band and the band bending $\Phi_s$ is 1.0 eV. Compared with this, the electronic band gap $E_g$ of the fibrinogen F is about 1.8 eV, and the position of the Fermi level $E_f$ is about 0.9 eV below the lower edge $E_c$ of the conduction band. The critical energy level of the fibrinogen F is between $-0.9$ and $-1.3$ eV and the upper region of the valence band $E_v$ of the pure amorphous silicon is also situated in this region with a high density of solid states. Because of this, the charge transfer between fibrinogen F and pure amorphous silicon a-Si:H is possible and the surface coating is thrombogenic.

Figure 3:
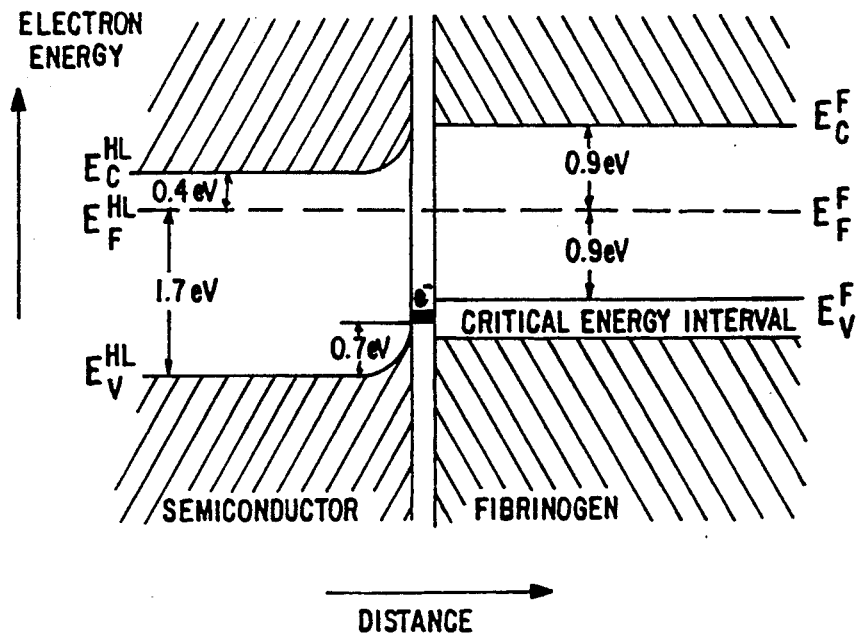
FIG. 3 is a diagram showing the charge distribution and potentials at the interface between an amorphous silicon carbide produced with 50% of methane and an aqueous fibrinogen solution.

FIG. 3 shows the charge distribution and potentials as in FIG. 2 but for an amorphous silicon carbide a-$Si_{50}C_{50}$:H produced with 50% of methane. The band gap $E_g$ of HL has increased to 2.1 eV, the position of the Fermi level $E_f$ remains at about 0.4 eV below the lower edge $E_c$ of the conduction band and the band bending $\Phi_s$ is 0.7 eV. Due to the band gap $E_g$ now being larger, only a small portion of the upper region of valence band $E_v$ of the amorphous silicon carbide is situated in the region of the critical energy level of the fibrinogen F so that the density of unoccupied states $D_{HL+}(E)$ is decreased by a magnitude of three, as will be explained subsequently with FIG. 4, so that a charge transfer is inhibited and the fibrinogen F remains stable and the surface coating is no longer thrombogenic.

Figures 4A, 4B, 4C, 4D:
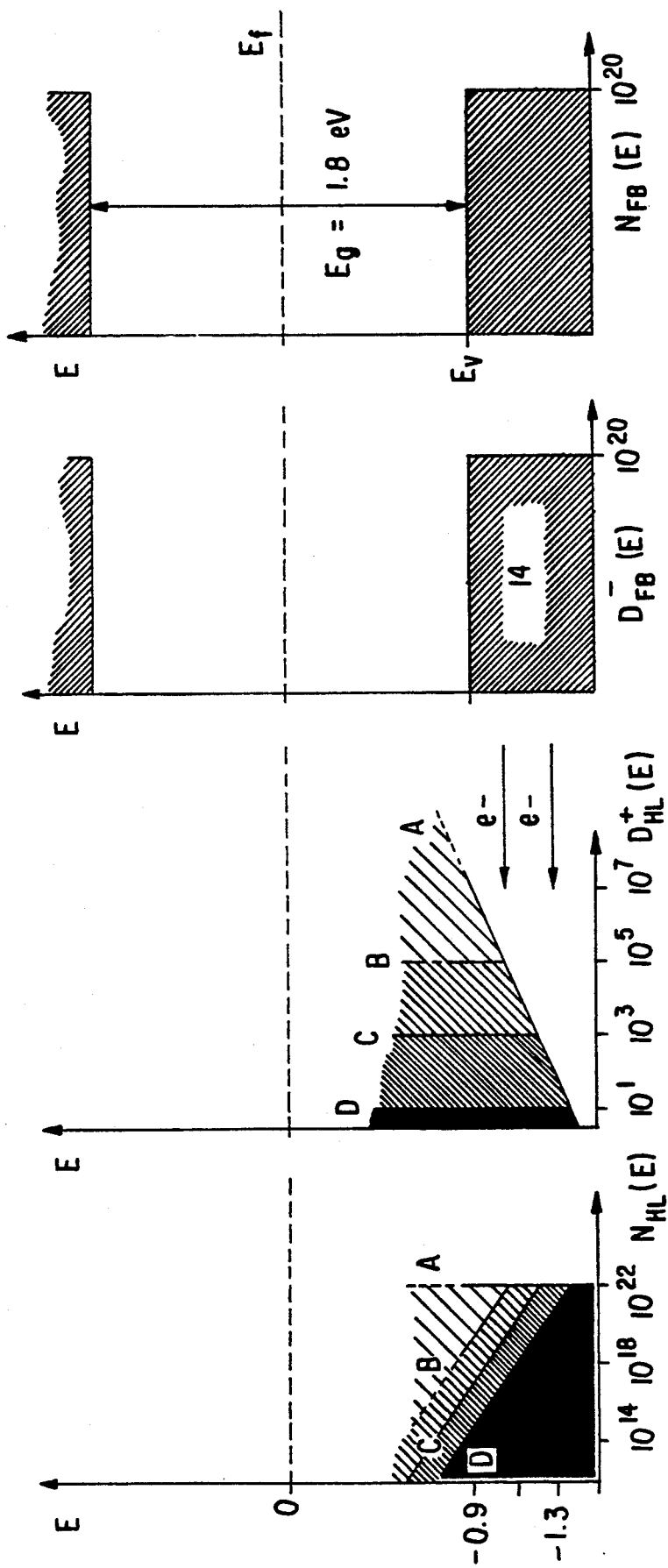
FIGS. 4(a)-4(d) are diagrams of the schematic distribution of the density of states and the number of occupied or unoccupied states in the fibrinogen or semiconductor respectively.

As shown in FIG. 4d the complete density of states $N_{FB}(E)$ in the valence band 14 of the fibrinogen FB is about $10^{20}$ cm$^{-3}$ eV$^{-1}$ and at body temperature almost any state is occupied by electrons, so that the density of occupied states $D_{FB}(E)$ as shown in FIG. 4c has the same value.

The upper limit for the density of states $N_{HL}(E)$ in a semiconductor is given by the number of atoms in a solid of about $10^{22}$ atoms per cm$^3$ as shown in FIG. 4a. FIG. 4b shows four different distributions of unoccupied states (A, B, C and D). The corresponding densities of states NHL(E) are shown in FIG. 4a. Case A with a constant density of states of about $10^{22}$cm$^{-3}$ eV$^{-1}$ is equivalent to a common noble metal. B, C, and D correspond to semiconductors with increasing band gap.

The exchange current is determined by the density of unoccupied states $D_{HL+}(E)$ in the valence band of the semiconductor. In order to decrease the exchange current this density has to be lowered. Therefore by increasing the band gap as shown in FIG. 3, so that the upper edge of the valence band $E_v$ of HL is at $-1.7$ eV and the band bending $\Phi_s$ is only 0.7 eV the density of unoccupied states $D_{HL+}(E)$ in this region also decreases by a magnitude of three.

Figure 5:
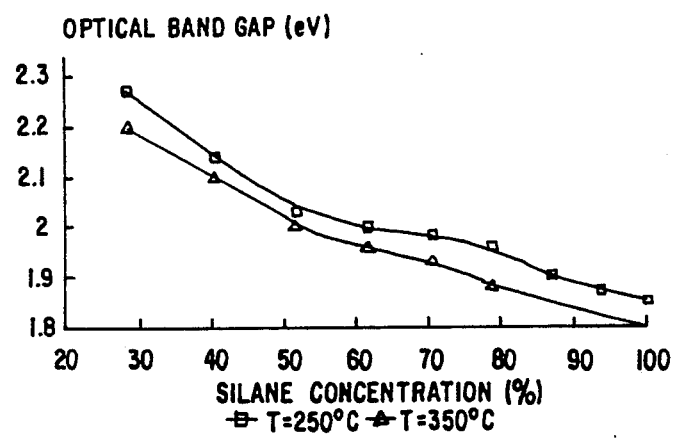
FIG. 5 is a diagram showing the influence of the methane concentration on the band gap of an amorphous silicon carbide for two different substrate temperatures, 250° C. and 350° C.

The effect of the silane and therefore also the methane concentration (methane concentration and silane concentration=100%) on the band gap is illustrated in FIG. 5 for two substrate temperatures 250° C. and 350° C. The largest band gap is obtained when the concentration of methane is high and the concentration of silane is low. In addition, the achievable band gap is larger with the lower substrate temperature of 250° C.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma enhanced chemical vapor deposition (PECVD) process for producing an amorphous semiconductive surface coating of hydrogenated silicon carbide (a-SiC:H) having an improved blood compatibility, the process comprising:
    (a) positioning a substrate to be coated in a reactor chamber;
    (b) heating the substrate to a substrate temperature ranging from 0° C. to 350° C.;
    (c) providing a flow of a reactive gas mixture comprised of:
        (1) from about 50 to about 100% of methane (CH$_4$),
        (2) from about 0 to about 50% of silane (SiH$_4$), and
        (3) from about 0 to about 2% of phosphine (PH$_3$),
        the flow having a flow rate based on a flow rate of silane (SiH$_4$) which ranges from 10 to 50 sccm, the methane (CH$_4$) and the phosphine (PH$_3$) having respective flow rates which are based on the flow rate of the silane (SiH$_4$);
    (d) introducing the flow of the reactive gas mixture into the reactor chamber to provide a process pressure ranging from 0.2 to 1 mbar;
    (e) generating a plasma with a power supply under conditions effective to deposit on the substrate an amorphous semiconductive surface coating of hydrogenated silicon carbide (a-SiC:H) having an electronic band gap greater than 2.0 eV between its valance band and its conduction band, and having an electrical conductivity greater than $10^{-4}$ $(\Omega\text{cm})^{-1}$, whereby the amorphous semiconductive surface coating has an improved compatibility with blood.

2. The process according to claim 1, wherein the substrate temperature is 250° C., wherein the reactive gas mixture is comprised of from 50 to 60% methane (CH$_4$), from 40 to 50% silane (SiH$_4$), and from 0.2 to 0.5% phosphine (PH$_3$), and wherein the process pressure is 0.1 mbar.

3. The process according to claim 1, wherein the power supply for plasma generation is a radiofrequency generator operating at a frequency which is essentially 13.5 MHz.

4. The process according to claim 1, wherein hydrogen is used as a substrate gas, wherein the silane (SiH$_4$) is diluted 1 to 9 with hydrogen, and wherein the phosphine (PH$_3$) is diluted 1 to 999 with hydrogen.

* * * * *

UNITED STATES PATENT AND TRADEMARK OFFICE
CERTIFICATE OF CORRECTION

PATENT NO. : 5,238,866
DATED : August 24, 1993
INVENTOR(S) : Armin Bolz, et. al.

It is certified that error appears in the above-indentified patent and that said Letters Patent is hereby corrected as shown below:

On the Title page, item [73], change the Assignee's name to -- Biotronik Mess- und Therapiegerate GMbH & Co., Ingenieurburo Berlin--.

Signed and Sealed this

Fifteenth Day of March, 1994

*Attest:*

BRUCE LEHMAN

*Attesting Officer*     *Commissioner of Patents and Trademarks*